(12) United States Patent
Hase

(10) Patent No.: US 9,331,639 B2
(45) Date of Patent: May 3, 2016

(54) POWER AMPLIFICATION CIRCUIT AND POWER AMPLIFICATION MODULE

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/643,052

(22) Filed: Mar. 10, 2015

(65) Prior Publication Data

US 2015/0180427 A1 Jun. 25, 2015

Related U.S. Application Data

(63) Continuation of application No. PCT/JP2013/068049, filed on Jul. 1, 2013.

(30) Foreign Application Priority Data

Nov. 30, 2012 (JP) .................. 2012-262761

(51) Int. Cl.
*H03F 3/19* (2006.01)
*H03G 3/30* (2006.01)
*H03F 1/32* (2006.01)
*H03F 1/02* (2006.01)
*H03F 1/56* (2006.01)
*H03F 3/21* (2006.01)
(Continued)

(52) U.S. Cl.
CPC ............... *H03F 1/32* (2013.01); *H03F 1/0266* (2013.01); *H03F 1/0272* (2013.01); *H03F 1/56* (2013.01); *H03F 3/19* (2013.01); *H03F 3/195* (2013.01); *H03F 3/211* (2013.01); *H03F 3/245* (2013.01); *H03G 3/3042* (2013.01); *H03F 2200/222* (2013.01); *H03F 2200/318* (2013.01); *H03F 2200/387* (2013.01); *H03F 2200/408* (2013.01); *H03F 2200/451* (2013.01); *H03F 2200/555* (2013.01); *H03F 2203/21131* (2013.01)

(58) Field of Classification Search
USPC .................... 330/285, 296, 310, 98, 133, 150
See application file for complete search history.

(56) References Cited

U.S. PATENT DOCUMENTS 7,920,027 B2 * 4/2011 Keerti ........................... 330/264

FOREIGN PATENT DOCUMENTS

JP 2001-274636 A 10/2001
JP 2002-335135 A 11/2002
(Continued)

OTHER PUBLICATIONS

International Search Report issued in Application No. PCT/JP2013/068049 dated Oct. 1, 2013.
(Continued)

*Primary Examiner* — Hieu Nguyen
(74) *Attorney, Agent, or Firm* — Pearne & Gordon LLP

(57) ABSTRACT

It is possible to increase linearity in a power amplification circuit. A power amplification circuit includes a first amplification element which amplifies and outputs an input signal with a gain according to the level of the input signal and the level of a bias voltage, a second amplification element which has the same gain characteristic as the first amplification element and amplifies and outputs the input signal, and a variable bias voltage generation circuit which generates a bias voltage decreasing with an increase in level of an output signal of the second amplification element.

19 Claims, 9 Drawing Sheets

(51) Int. Cl.
*H03F 3/195* (2006.01)
*H03F 3/24* (2006.01)

(56) References Cited

FOREIGN PATENT DOCUMENTS

| JP | 2002-359321 A | 12/2002 |
|---|---|---|
| JP | 2003-037454 A | 2/2003 |
| JP | 3641184 B2 | 4/2005 |
| JP | 3751894 B2 | 3/2006 |
| JP | 2006-129443 A | 5/2006 |
| JP | 2006-333107 A | 12/2006 |
| JP | 2007-174553 A | 7/2007 |
| JP | 2007-306278 A | 11/2007 |
| JP | 2008-004987 A | 1/2008 |
| JP | 2010-206545 A | 9/2010 |
| JP | 2010-219944 A | 9/2010 |

OTHER PUBLICATIONS

Written Opinion issued in International Application No. PCT/JP2013/068049 dated Oct. 1, 2013.

* cited by examiner

POWER AMPLIFICATION CIRCUIT AND POWER AMPLIFICATION MODULE

BACKGROUND OF THE INVENTION

1. Technical Field

The present invention relates to a power amplification circuit and a power amplification module.

2. Background Art

In a mobile communication device, such as a mobile phone, a power amplification circuit (power amplifier) is used in order to amplify power of a signal to be transmitted to a base station (for example, Patent Document 1). In recent years, a mobile phone uses a modulation system, such as HSUPA (High Speed Uplink Packet Access), LTE (Long Term Evolution), or LTE-Advanced, which is the standard of high-speed data communication. In this communication standard, it is important to reduce deviation in phase or amplitude in order to improve a communication speed. That is, high linearity is required in the power amplification circuit.

CITATION LIST

Patent Document

Patent Document 1: JP2003-37454 A

SUMMARY OF THE INVENTION

On the other hand, in this power amplification circuit, non-linearity of an amplification element may affect the linearity of the power amplification circuit. For example, when controlling a bias voltage to be applied to a control electrode of a transistor as an amplification element constant, it is ideal to make a base current $I_{BE}$ of the transistor constant in order to maintain the linearity of the power amplification circuit. However, in practice, the non-linearity of the transistor causes an increase in the base current $I_{BE}$ of the transistor in a region where the level of output power is high, that is, a region where the level of an input signal to the power amplification circuit is high. If the base current $I_{BE}$ of the transistor increases, the gain of the power amplification circuit increases, causing degradation of linearity.

The invention has been accomplished in consideration of this situation, and an object of the invention is to increase the linearity of the power amplification circuit.

A power amplification circuit according to an aspect of the invention includes a first amplification element which amplifies and outputs an input signal with a gain according to a level of the input signal and a level of a bias voltage, a second amplification element which has the same gain characteristic as the first amplification element and amplifies and outputs the input signal, and a variable bias voltage generation circuit which generates a bias voltage, such that the voltage decreases with an increase in level of an output signal of the second amplification element.

According to the invention, it is possible to increase linearity in the power amplification circuit.

DETAILED DESCRIPTION OF THE INVENTION

Figure 1:
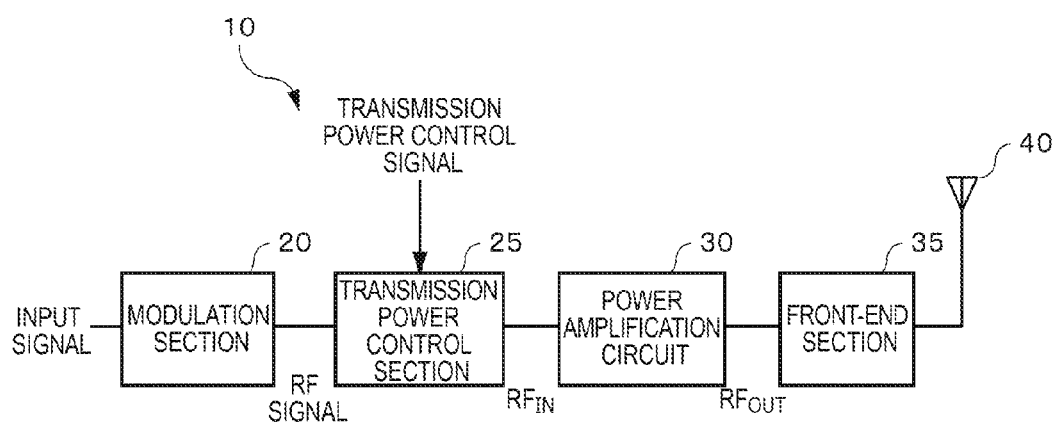
FIG. 1 is a diagram showing a configuration example of a transmission unit including a power amplification circuit according to an embodiment of the invention.

Hereinafter, an embodiment of the invention will be described referring to the drawings. FIG. 1 is a diagram showing a configuration example of a transmission unit including a power amplification circuit according to an embodiment of the invention. A transmission unit 10 is, for example, used to transmit various signals, such as sound or data, to a base station in a mobile communication device, such as a mobile phone. Although the mobile communication device includes a reception unit which receives signals from the base station, description of the reception unit will be omitted.

As shown in FIG. 1, the transmission unit 10 includes a modulation section 20, a transmission power control section 25, a power amplification circuit 30, a front-end section 35, and an antenna 40.

The modulation section 20 modulates an input signal based on a modulation system, such as HSUPA or LTE, and generates a high-frequency (RF) signal for radio transmission. The RF signal is, for example, about hundreds of MHz to several GHz.

The transmission power control section 25 adjusts the power of the RF signal based on a transmission power control signal and outputs the RF signal. The transmission power control signal is generated based on, for example, an adaptive power control (APC) signal transmitted from the base station. For example, the base station measures a reception signal from the mobile communication device, thereby transmitting the adaptive power control signal to the mobile communication device as a command to adjust transmission power in the mobile communication device to an appropriate level.

The power amplification circuit 30 amplifies the power of the RF signal ($RF_{IN}$) output from the transmission power control section 25 to a level necessary for transmission to the base station and outputs an amplified signal ($RF_{OUT}$).

The front-end section 35 performs filtering on the amplified signal, switching between the amplified signal and the reception signal received from the base station, or the like.

The amplified signal output from the front-end section 35 is transmitted to the base station through the antenna 40.

Figure 2:
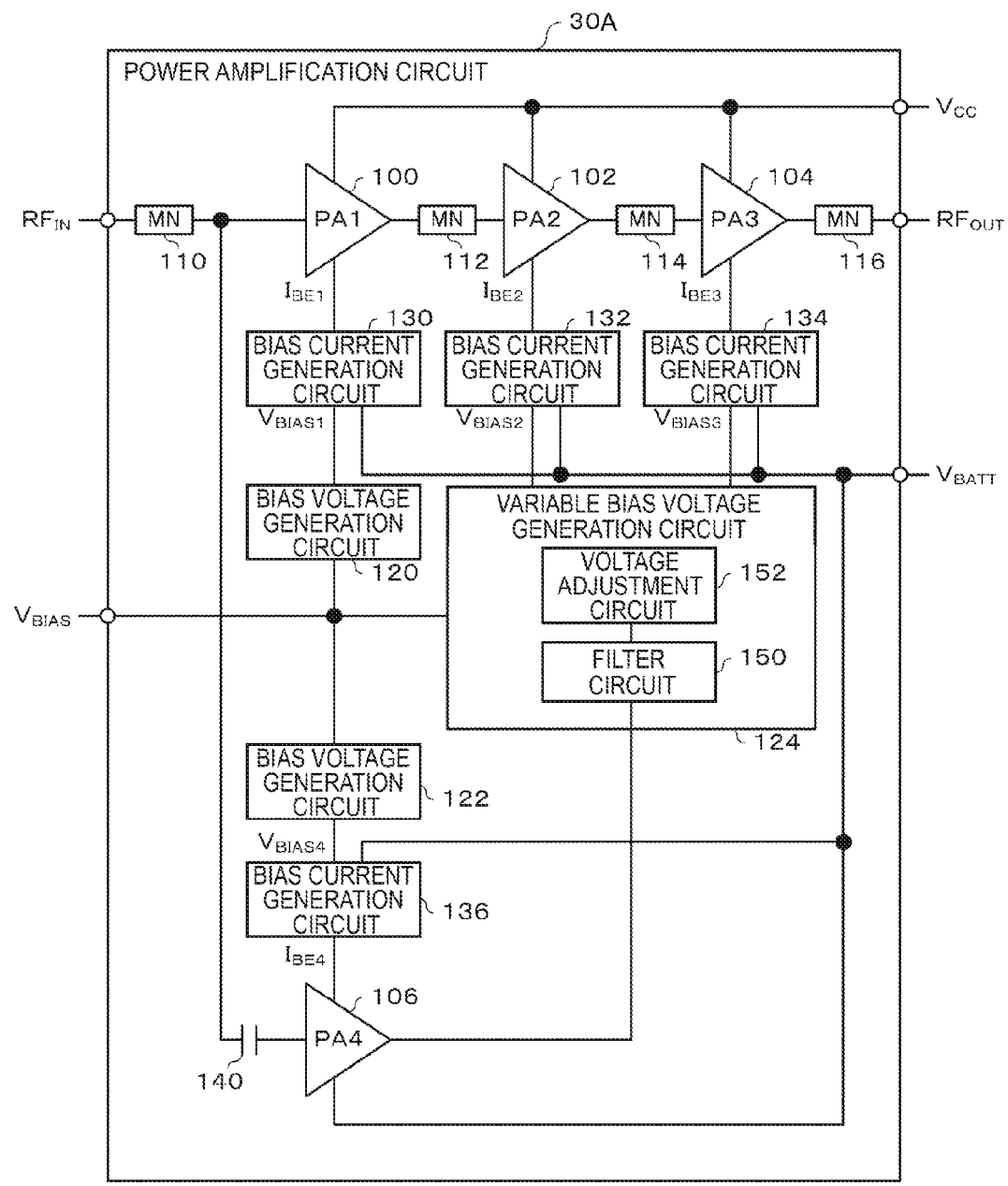
FIG. 2 is a diagram showing an example of the configuration of a power amplification circuit.

FIG. 2 is a diagram showing an example of the configuration of the power amplification circuit 30A. As shown in FIG. 2, the power amplification circuit 30A includes power amplifiers 100, 102, 104, and 106, matching circuits (Matching Networks) 110, 112, 114, and 116, bias voltage generation circuits 120 and 122, a variable bias voltage generation circuit 124, bias current generation circuits 130, 132, 134, and 136, and a capacitor 140.

The power amplifiers 100, 102, and 104 constitute a three-stage power amplification circuit, amplify the input RF signal ($RF_{IN}$), and output the amplified signal ($RF_{OUT}$). The gain of each of the power amplifiers 100, 102, and 104 depends on the level of the input signal and the level of a bias voltage. For example, when the bias voltage is at a fixed level, if the bias current (base current $I_{BE}$) increases with an increase in level of the input signal, the gain of each of the power amplifiers 100, 102, and 104 increases. For example, if the bias voltage decreases, the bias current (base current $I_{BE}$) decreases, and the gain of each of the power amplifiers 100, 102, and 104 decreases. The matching circuits 110, 112, 114, and 116 for impedance matching are provided at the input and output of the power amplifiers 100, 102, and 104.

The bias voltage generation circuit 120 generates a fixed bias voltage $V_{BIAS1}$ for the power amplifier 100 based on a voltage $V_{BIAS}$ at a predetermined level. The bias current generation circuit 130 generates a bias current (base current) $I_{BE1}$ of the power amplifier 100 based on the bias voltage $V_{BIAS1}$.

The variable bias voltage generation circuit 124 generates variable bias voltages $V_{BIAS2}$ and $V_{BIAS3}$ for the power amplifiers 102 and 104. Specifically, the variable bias voltage generation circuit 124 generates the variable bias voltages $V_{BIAS2}$ and $V_{BIAS3}$ which decrease with an increase in level of the output signal of the power amplifier 106. The variable bias voltage generation circuit 124 includes a filter circuit 150 and a voltage adjustment circuit 152. The filter circuit 150 attenuates an AC component (fundamental-wave component and harmonic component) included in the output signal of the power amplifier 106. The voltage adjustment circuit 152 generates the variable bias voltages $V_{BIAS2}$ and $V_{BIAS3}$ according to the level of the output signal of the filter circuit 150.

The bias current generation circuit 132 generates a bias current (base current) $I_{BE2}$ of the power amplifier 102 based on the bias voltage $V_{BIAS2}$. Similarly, the bias current generation circuit 134 generates a bias current (base current) $I_{BE3}$ of the power amplifier 104 based on the bias voltage $V_{BIAS3}$.

The power amplifier 106 includes a transistor which has the same gain characteristic as the transistor (amplification element) for power amplification in each of the power amplifiers 100, 102, and 104 and is small in size. The power amplifier 106 amplifies a signal input through the matching circuit 110 and the capacitor 140. That is, the power amplifier 106 is a circuit which imitates the operations of the power amplifiers 100, 102, and 104. The size of the power amplifier 106 may be the same as the power amplifiers 100, 102, and 104, but may be a size smaller than the power amplifiers 100, 102, and 104, thereby suppressing an increase in chip size or power consumption.

The bias voltage generation circuit 122 generates a fixed bias voltage $V_{BIAS4}$ for the power amplifier 106 based on the voltage $V_{BIAS}$ at a predetermined level. The bias current generation circuit 136 generates a bias current (base current) $I_{BE4}$ of the power amplifier 106 based on the bias voltage $V_{BIAS4}$.

Figure 3:
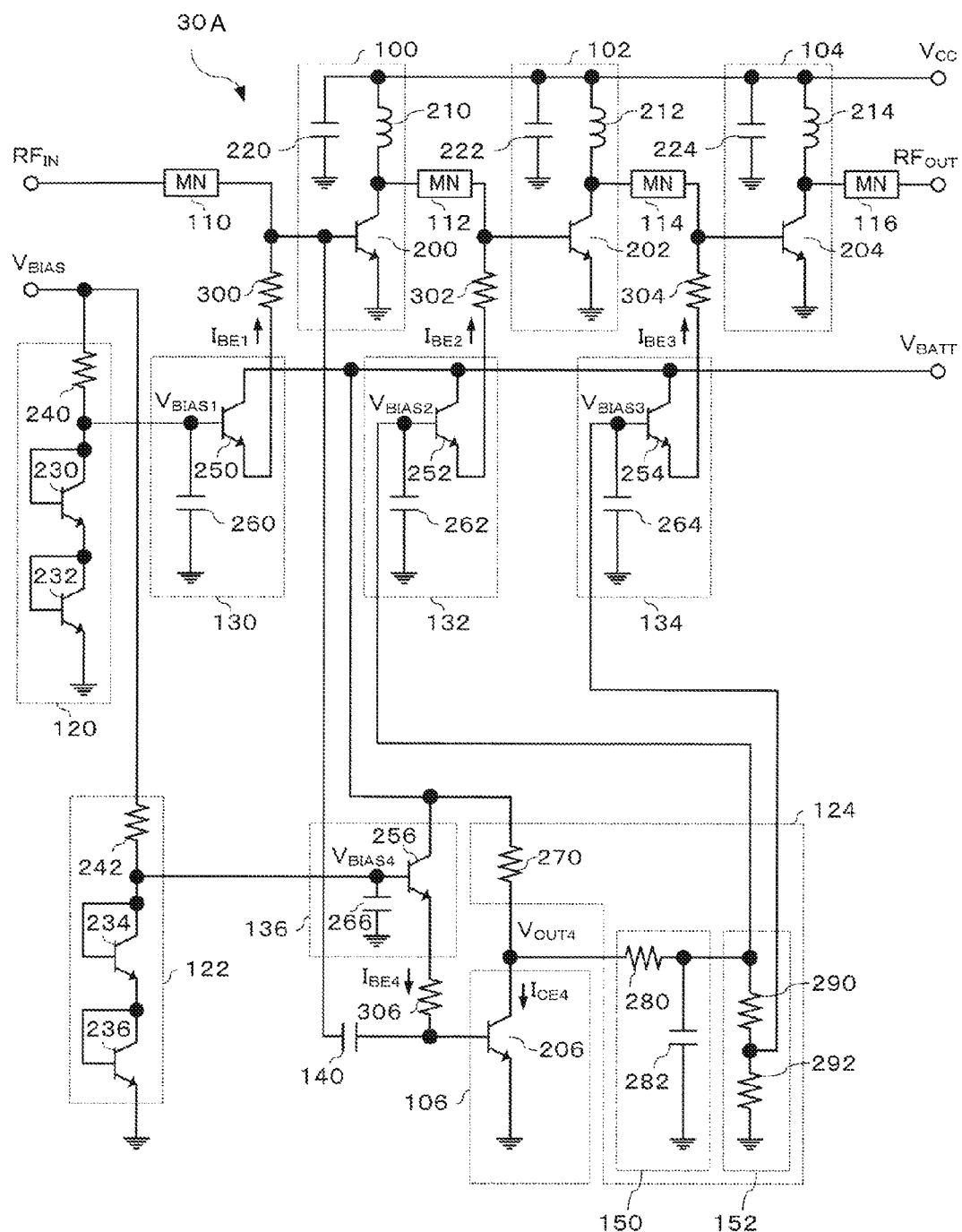
FIG. 3 is a diagram showing an example of the circuit configuration of the power amplification circuit shown in FIG. 2.

FIG. 3 is a diagram showing an example of the circuit configuration of the power amplification circuit 30A shown in FIG. 2. In the configuration shown in FIG. 3, the power amplifier 100 includes a transistor 200, a coil 210, and a capacitor 220. The transistor 200 is, for example, an amplification element, such as a hetero-bipolar transistor (HBT) or a field effect transistor (FET). Hereinafter, although a case where a transistor which is used in this embodiment is an HBT will be described, other transistors, such as an FET, may be used. Similarly, the power amplifier 102 includes a transistor 202, a coil 212, and a capacitor 222. The power amplifier 104 includes a transistor 204, a coil 214, and a capacitor 224.

The bias voltage generation circuit 120 includes diode-connected transistors 230 and 232 and a resistor 240. The voltage $V_{BIAS}$ is applied to the transistors 230 and 232 through the resistor 240. The bias voltage generation circuit 120 outputs the bias voltage $V_{BIAS1}$ at a fixed level generated between the resistor 240 and the collector of the transistor 230 to the bias current generation circuit 130.

The bias current generation circuit 130 includes a transistor 250 and a capacitor 260. The bias current generation circuit 130 generates the bias current (base current) $I_{BE1}$ based on the bias voltage $V_{BIAS1}$ applied to the base of the transistor 250 and supplies the bias current to the base of the transistor 200 through a resistor 300.

The bias voltage generation circuit 122 includes diode-connected transistors 234 and 236 and a resistor 242. The voltage $V_{BIAS}$ is applied to the transistors 234 and 236 through the resistor 242. The bias voltage generation circuit 122 outputs the bias voltage $V_{BIAS4}$ at a fixed level generated between the resistor 242 and the collector of the transistor 234 to the bias current generation circuit 136.

The bias current generation circuit 136 includes a transistor 256 and a capacitor 266. The bias current generation circuit 136 generates the bias current (base current) $I_{BE4}$ based on the bias voltage $V_{BIAS4}$ applied to the base of the transistor 256 and supplies the bias current to the base of a transistor 206 through a resistor 306.

The power amplifier 106 includes a transistor 206. The transistor 206 is an amplification element which has the same gain characteristic as the transistors 200, 202, and 204 and is small in size. A signal output from the matching circuit 110 is input to the base of the transistor 206 through the capacitor 140. A battery voltage $V_{BATT}$ is applied to the collector of the transistor 206 through a resistor 270, and the emitter of the transistor 206 is grounded. The transistor 206 generates a collector current $I_{CE4}$ as an output signal obtained by amplifying a signal input to the base.

The size of the transistor refers to the area of an emitter electrode in a bipolar connection transistor, such as an HBT, and refers to the electrode width of a gate electrode in an FET, such as a MOSFET. Although a transistor in a power amplifier closer to the output stage is of a larger size, the size of the transistor 206 is made smaller than the transistor 200 of smallest size among the transistors 200, 202, and 204 constituting the multi-stage-connected power amplifiers, whereby it is possible to reduce power consumption in the power amplification circuit 30 and the size of the power amplification circuit 30.

The variable bias voltage generation circuit 124 includes a resistor 270, a filter circuit 150, and a voltage adjustment circuit 152. The resistor 270 generates a voltage $V_{OUT4}$ which decreases with an increase in level of the output signal (collector current $I_{CE4}$) of the power amplifier 106.

The filter circuit 150 constitutes a low-pass filter including a resistor 280 and a capacitor 282. The cutoff frequency of the low-pass filter is, for example, about 150 MHz, and the filter circuit 150 can attenuate an AC component (fundamental-wave component and harmonic component) included in the output signal of the power amplifier 106, that is, an AC component included in the voltage $V_{OUT4}$. The configuration of the low-pass filter is not limited to the resistor 280 and the capacitor 282, and for example, a coil may be used instead of the resistor 280. The filter circuit 150 is not limited to a low-pass filter, and may be a band elimination filter or the like.

The voltage adjustment circuit 152 includes resistors 290 and 292. The voltage adjustment circuit 152 generates the bias voltages $V_{BIAS2}$ and $V_{BIAS3}$ from an output signal of the filter circuit 150 and respectively applies the bias voltages $V_{BIAS2}$ and $V_{BIAS3}$ to the bases of transistors 252 and 254. The resistance values of the resistors 290 and 292 can be arbitrarily determined according to the gains of the power amplifiers 102 and 104.

The bias current generation circuit 132 includes a transistor 252 and a capacitor 262. The bias current generation circuit 132 generates the bias current (base current) $I_{BE2}$ based on the variable bias voltage $V_{BIAS2}$ applied to the base of the transistor 252 and supplies the bias current to the base of the transistor 202 through a resistor 302.

The bias current generation circuit 134 includes a transistor 254 and a capacitor 264. The bias current generation circuit 134 generates the bias current (base current) $I_{BE3}$ based on the variable bias voltage $V_{BIAS3}$ applied to the base of the transistor 254 and supplies the bias current to the base of the transistor 204 through a resistor 304.

The operation of the power amplification circuit 30A will be described based on the configuration shown in FIG. 3. The power amplifiers 100, 102, and 104 constitute a three-stage amplification circuit, amplify the input signal $RF_{IN}$, and output the amplified signal $RF_{OUT}$. The input signal $RF_{IN}$ is also input to the power amplifier 106 through the matching circuit 110 and the capacitor 140. The transistor 206 constituting the power amplifier 106 generates the output signal (collector current $I_{CE4}$) by amplifying a signal input to the base.

Figure 4A:
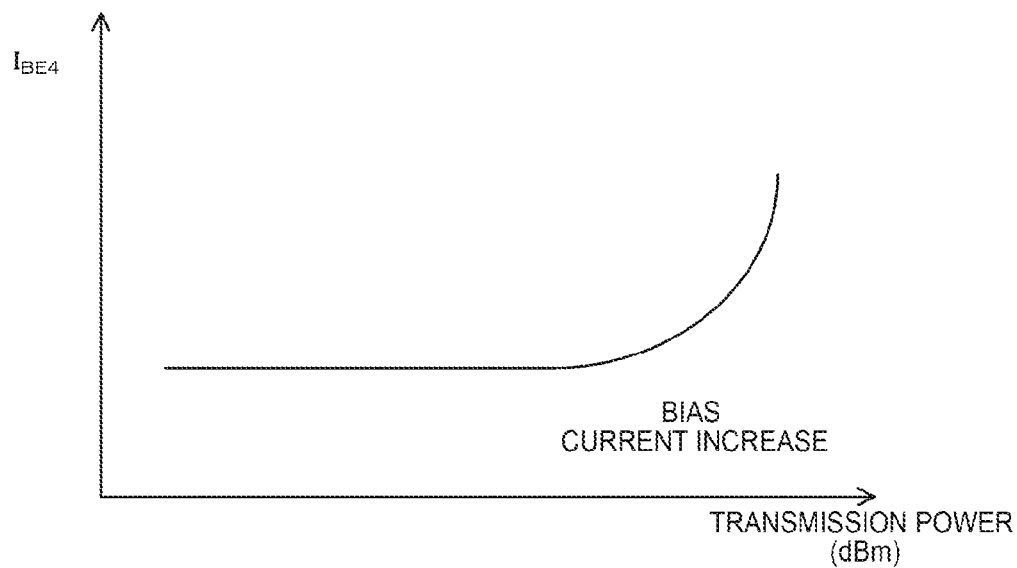
FIG. 4A is a diagram showing an example of the relationship between the level of transmission power and a bias current (base current) $I_{BE4}$.
Figure 4B:
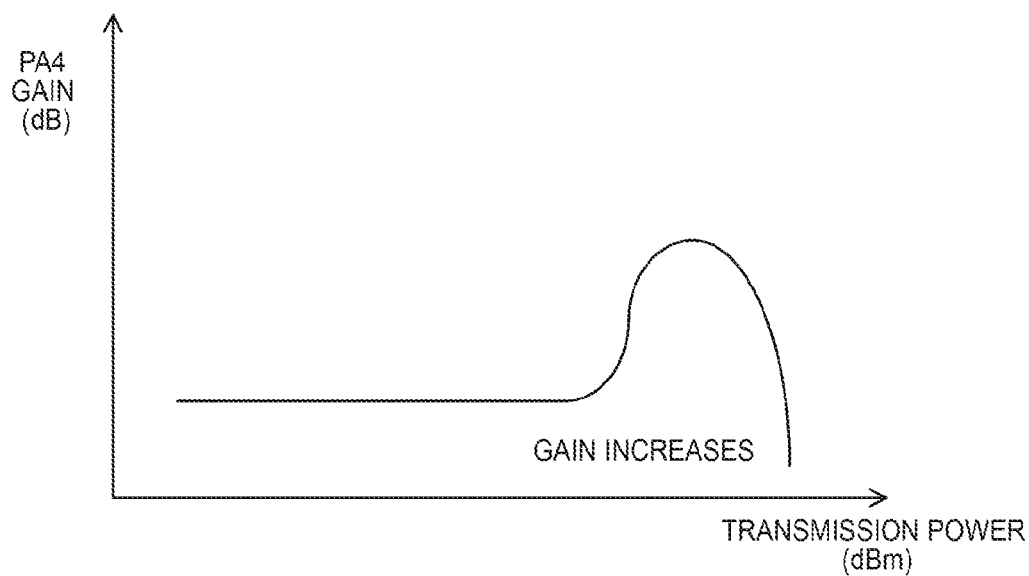
FIG. 4B is a diagram showing an example of the relationship between the level of transmission power and the gain of a power amplifier for imitation.

Similarly to the transistors 200, 202, and 204, the transistor 206 has a nonlinear gain characteristic in a region where the level of transmission power (the level of the input signal $RF_{IN}$) is high. For this reason, as shown in FIG. 4A, the bias current (base current) $I_{BE4}$ increases in a region where the level of transmission power (the level of the input signal $RF_{IN}$) is high. Accordingly, as shown in FIG. 4B, the gain of the power amplifier 106 increases, and the level of the output signal (collector current $I_{CE4}$) of the power amplifier 106 increases.

The variable bias voltage generation circuit 124 converts the output signal of the power amplifier 106 to the voltage $V_{OUT4}$ by the resistor 270. The voltage $V_{OUT4}$ decreases with an increase in level of the output signal. The filter circuit 150 attenuates an AC component (fundamental-wave component and harmonic component) and extracts a DC component from the voltage $V_{OUT4}$. The voltage adjustment circuit 152 generates the variable bias voltages $V_{BIAS2}$ and $V_{BIAS3}$ from the output of the filter circuit 150 by the resistors 290 and 292 and supplies the variable bias voltages $V_{BIAS2}$ and $V_{BIAS3}$ to the bias current generation circuits 132 and 134. The variable bias voltages $V_{BIAS2}$ and $V_{BIAS3}$ become voltages which decrease with an increase in level of the output signal (collector current $I_{CE4}$) of the power amplifier 106.

Figure 4C:
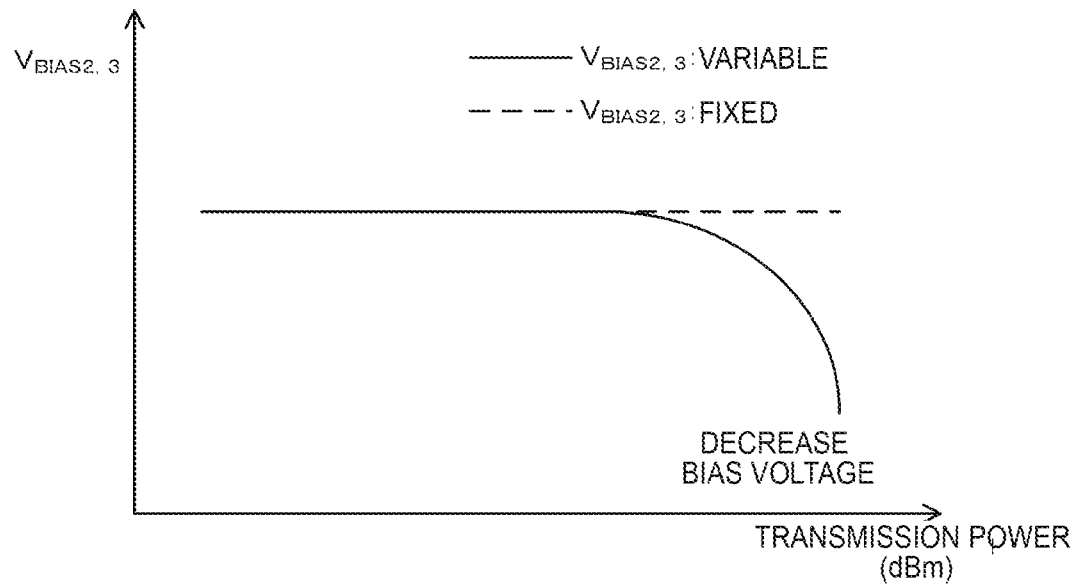
FIG. 4C is a diagram showing an example of the relationship between the level of transmission power and bias voltages $V_{BIAS2}$ and $V_{BIAS3}$.
Figure 4D:
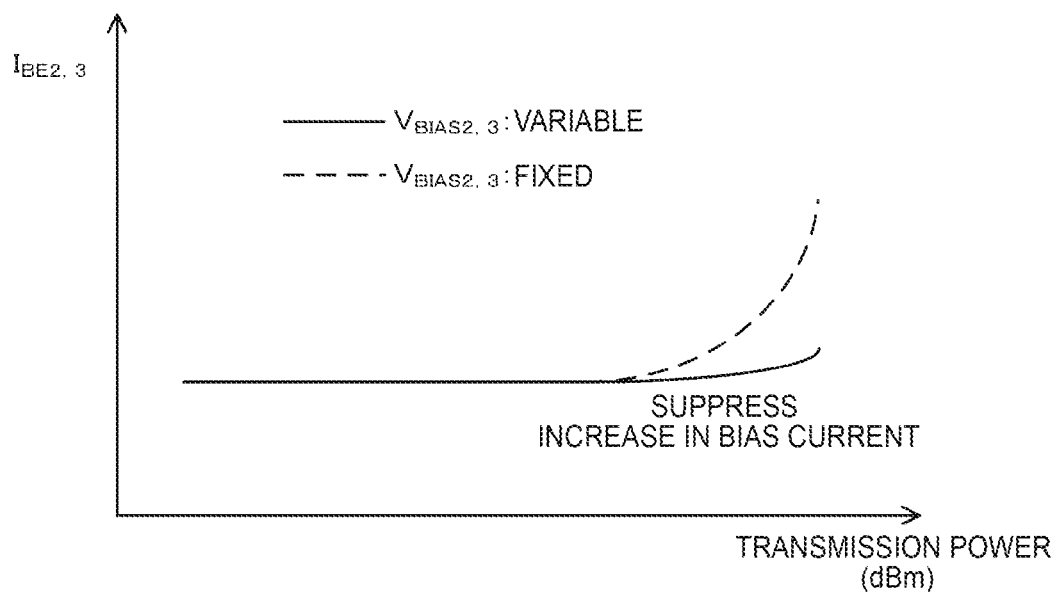
FIG. 4D is a diagram showing an example of the relationship between the level of transmission power and bias currents (base currents) $I_{BE2}$ and $I_{BE3}$.
Figure 4E:
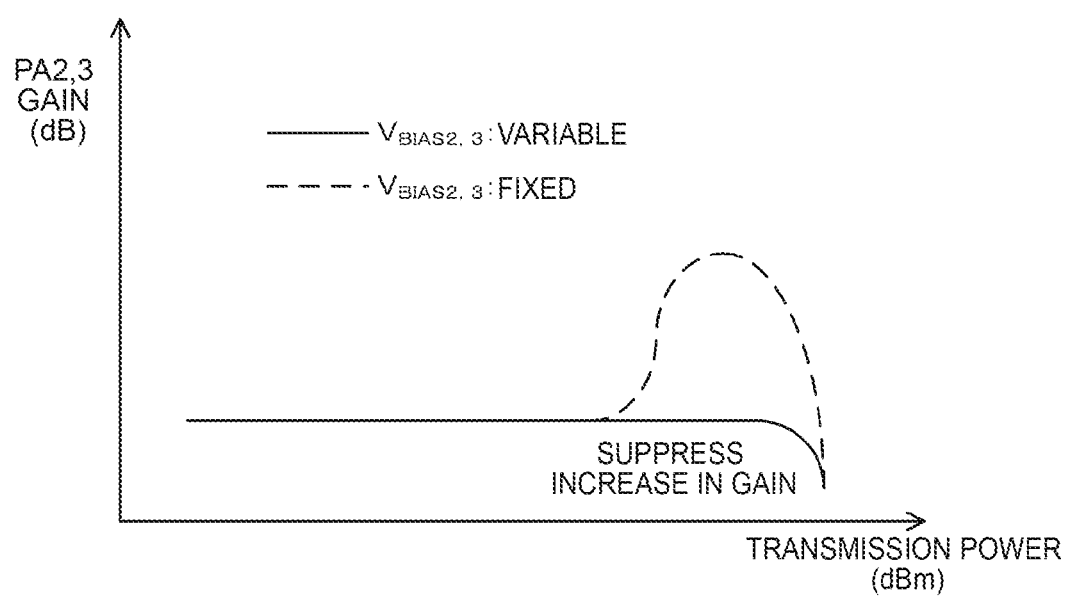
FIG. 4E is a diagram showing an example of the relationship between the level of transmission power and the gain of a power amplifier for power amplification.

FIG. 4C is a diagram showing an example of the relationship between the level of transmission power and the bias voltages $V_{BIAS2}$ and $V_{BIAS3}$. FIG. 4D is a diagram showing an example of the relationship between the level of transmission power and the bias currents (base currents) $I_{BE2}$ and $I_{BE3}$. FIG. 4E is a diagram showing an example of the relationship between the level of transmission power and the gain of a power amplifier for power amplification. In FIGS. 4C to 4E, a solid line represents when the bias voltages $V_{BIAS2}$ and $V_{BIAS3}$ are variable, and a broken line represents when the bias voltages $V_{BIAS2}$ and $V_{BIAS3}$ are fixed.

As shown in FIG. 4C, the variable bias voltage generation circuit 124 can decrease the variable bias voltages $V_{BIAS2}$ and $V_{BIAS3}$ in a region where the level of transmission power (the level of the input signal $RF_{IN}$) is high. For this reason, as shown in FIG. 4D, it is possible to suppress an increase in the bias currents (base currents) $I_{BE2}$ and $I_{BE3}$ for the power amplifiers 102 and 104 in a region where the level of transmission power (the level of the input signal $RF_{IN}$) is high. An increase in the bias currents (base currents) $I_{BE2}$ and $I_{BE3}$ is suppressed, whereby, as shown in FIG. 4E, it is possible to suppress an increase in gain of the power amplifiers 102 and 104 in a region where the level of transmission power (the level of the input signal $RF_{IN}$) is high. With this, it is possible to increase linearity in the power amplification circuit 30.

In FIGS. 2 and 3, although the configuration including the three stages of power amplifiers has been described as an example of the power amplification circuit 30, the number of stages of power amplifiers is not limited thereto, and one stage or two stages may be provided, or four or more states may be provided. In the configuration shown in FIGS. 2 and 3, although the bias voltages $V_{BIAS2}$ and $V_{BIAS3}$ for the second and third-stage power amplifiers 102 and 104 are controlled, a bias voltage to be controlled is not limited thereto. For example, only the bias voltage $V_{BIAS3}$ for the power amplifier 104 may be controlled, and the bias voltages $V_{BIAS1}$, $V_{BIAS2}$, and $V_{BIAS3}$ for all stages of power amplifiers 100, 102, and 104 may be controlled.

Figure 5:
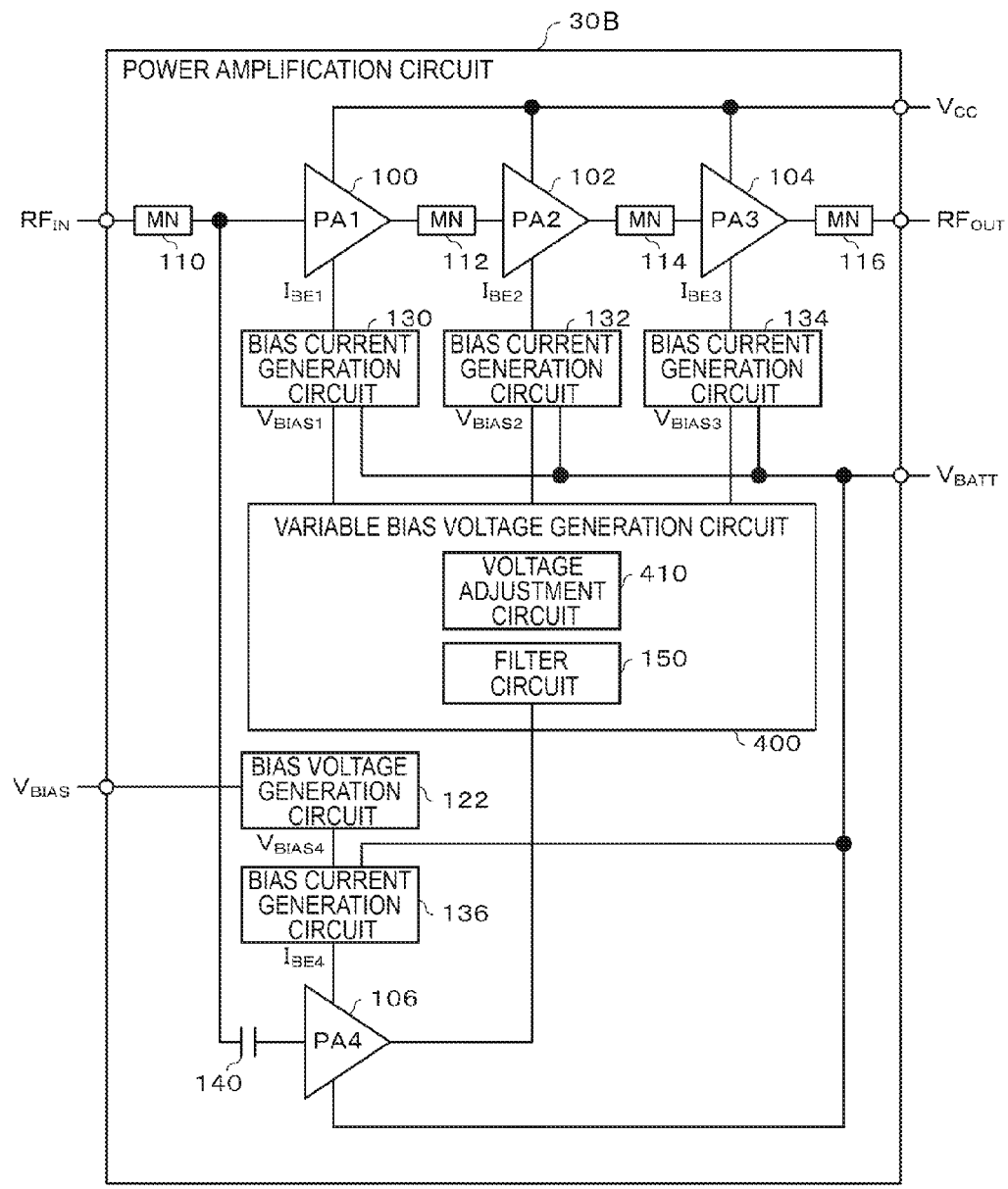
FIG. 5 is a diagram showing a configuration example of a power amplification circuit when bias voltages of all stages of power amplifiers are controlled.

FIG. 5 is a diagram showing a configuration example of the power amplification circuit 30B when bias voltages for all stages of power amplifiers are controlled. A difference from the configuration shown in FIG. 2 is that, instead of the bias voltage generation circuit 120, a voltage adjustment circuit 410 of a variable bias voltage generation circuit 400 generates the variable bias voltage $V_{BIAS1}$ for the power amplifier 100. Similarly to the configuration of FIG. 2, the voltage adjustment circuit 410 also generates the variable bias voltages $V_{BIAS2}$ and $V_{BIAS3}$ for the power amplifiers 102 and 104.

Figure 6:
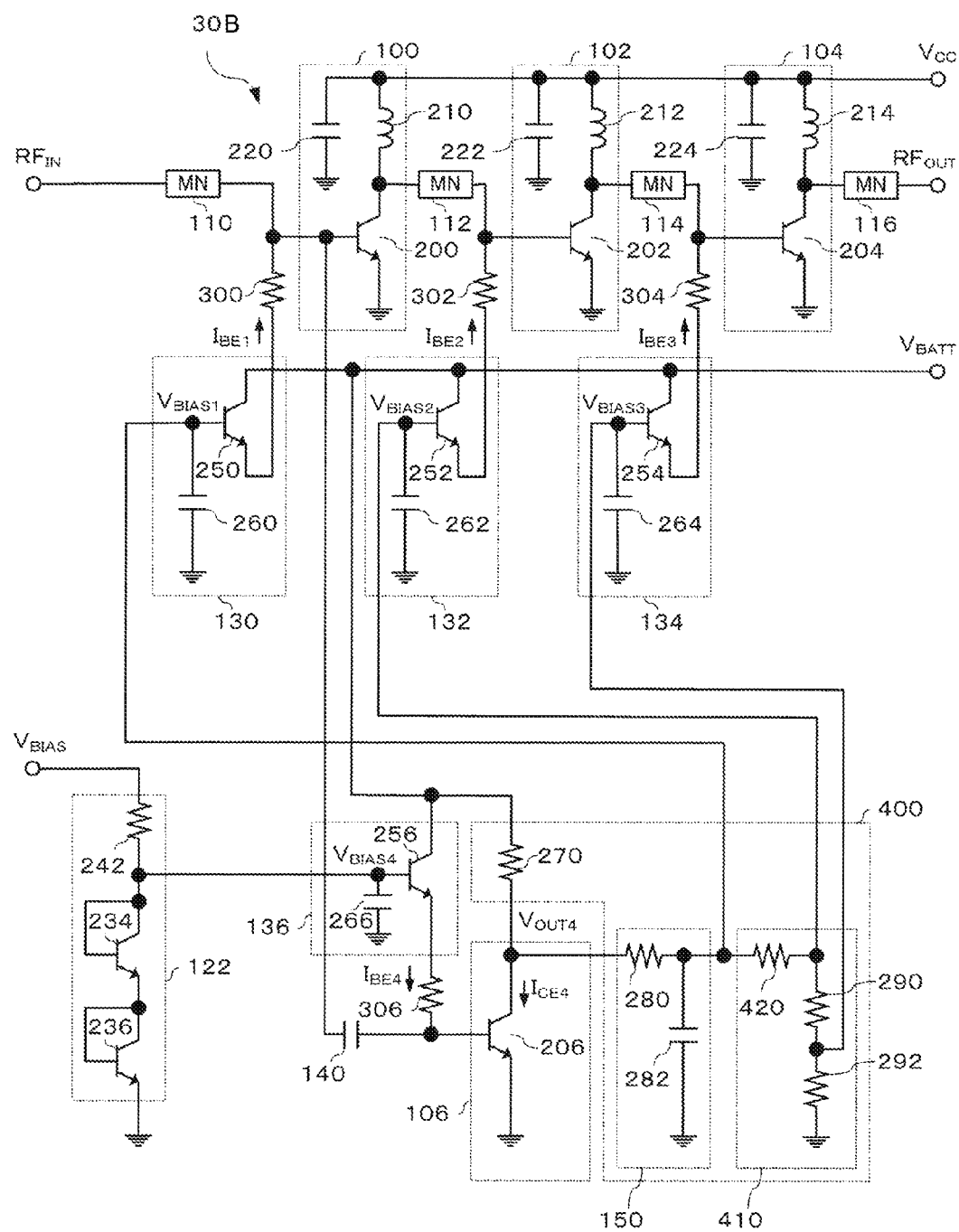
FIG. 6 is a diagram showing an example of the circuit configuration of the power amplification circuit shown in FIG. 5.

FIG. 6 is a diagram showing an example of the circuit configuration of the power amplification circuit 30B shown in FIG. 5. A difference from the configuration shown in FIG. 3 is that the voltage adjustment circuit 410 includes a resistor 420 between the filter circuit 150 and the resistors 290 and 292. The voltage adjustment circuit 410 supplies a voltage generated on the terminal of the resistor 420 on the filter circuit 150 side to the bias current generation circuit 130 as the variable bias voltage $V_{BIAS1}$. Therefore, similarly to the variable bias voltages $V_{BIAS2}$ and $V_{BIAS3}$, the variable bias voltage $V_{BIAS1}$ is controlled so as to decrease in a region where the level of transmission power (the level of the input signal $RF_{IN}$) is high.

Figure 7:
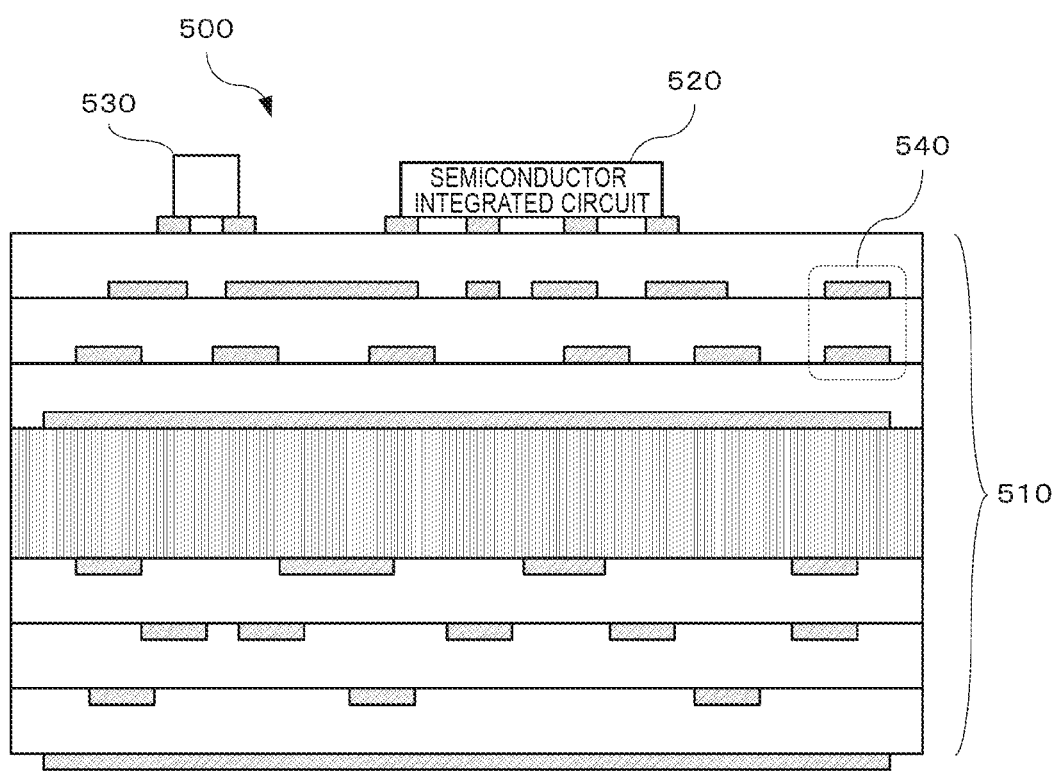
FIG. 7 is a diagram showing an example of the configuration of a power amplification module including a power amplification circuit.

FIG. 7 is a diagram showing an example of the configuration of a power amplification module (composite module) including the power amplification circuit 30. A power amplification module 500 is constituted using a multilayer substrate 510. A semiconductor integrated circuit 520 in which the power amplification circuit 30 is integrated is mounted on the principal surface of the multilayer substrate 510. It is not necessary to integrate all elements constituting the power amplification circuit 30, and some elements may be provided outside the semiconductor integrated circuit 520. For example, since the capacitor 282 constituting the filter circuit 150 is large in size, the capacitor 282 may be formed on the principal surface of the multilayer substrate 510 as a chip capacitor 530. Interlayer capacitance which is formed by an electrode pair 540 between adjacent layers of the multilayer substrate 510 may be used as the capacitor 282.

The power amplification circuit and the power amplification module of these embodiments have been described. According to these embodiments, it is possible to decrease a bias voltage for an amplification power amplifier with an increase in level of the output signal of an imitation power amplifier which imitates the operation of an amplification power amplifier. That is, it is possible to suppress an increase in gain by decreasing a bias voltage in a region where the gain increases when a fixed bias voltage is supplied to the power amplifier for amplification. With this, it is possible to increase linearity in the power amplification circuit.

According to the power amplification circuit of these embodiments, the size of the imitation power amplifier can be made smaller than the size of the amplification power amplifier, whereby it is possible to suppress an increase in chip size or power consumption.

According to the power amplification circuit of these embodiments, when the power amplification circuit has a plurality of stages of power amplifiers, a bias voltage for a final-stage power amplifier or a power amplifier close to the final stage can be controlled, whereby it is possible to effectively suppress fluctuation in gain in the entire power amplification circuit.

According to the power amplification circuit of these embodiments, when the power amplification circuit has a plurality of stages of power amplifiers, it is possible to set the level of the bias voltage for each power amplifier to a level according to the gain of each power amplifier.

According to the power amplification circuit of these embodiments, the AC component of the output signal of the power amplifier can be attenuated by the filter circuit, whereby it is possible to suppress fluctuation in bias voltage due to the AC component.

According to the power amplification module of these embodiments, it is possible to form a capacitor constituting a filter in the power amplification circuit separately from the semiconductor integrated circuit of the power amplifier for power amplification. For example, the semiconductor integrated circuit can be mounted on the multilayer substrate, and a chip capacitor mounted on the multilayer substrate or interlayer capacitance of the multilayer substrate may be used as a capacitor constituting a filter. With this, it is possible to suppress an increase in size of the semiconductor integrated circuit.

These embodiments facilitate understanding of the invention and are not intended to limit the interpretation of the invention. The invention may be changed or improved without departing from the spirit of the invention, and equivalents thereof still fall within the scope of the invention.

REFERENCE SIGNS LIST

10: transmission unit
20: modulation section
25: transmission power control section
30: power amplification circuit
35: front-end section
40: antenna
100, 102, 104, 106: power amplifier
110, 112, 114, 116: matching circuit
120, 122: bias voltage generation circuit
124, 400: variable bias voltage generation circuit
130, 132, 134, 136: bias current generation circuit
140: capacitor
150: filter circuit
152, 410: voltage adjustment circuit
200, 202, 204, 206: transistor
210, 212, 214: coil
220, 222, 224: capacitor
230, 232, 234, 236: transistor
240, 242: resistor
250, 252, 254, 256: transistor
260, 262, 264, 266, 282: capacitor
270, 280, 290, 292, 300, 302, 304, 306, 420: resistor

The invention claimed is:

1. A power amplification circuit comprising:
a first amplification element which amplifies and outputs an input signal with a gain according to a level of the input signal and a level of a bias voltage;
a second amplification element which has the same gain characteristic as the first amplification element and amplifies and outputs the input signal; and
a variable bias voltage generation circuit which generates the bias voltage, such that the bias voltage decreases with an increase in level of an output signal of the second amplification element,
wherein the variable bias voltage generation circuit includes a filter circuit which attenuates an AC component of an output signal of the second amplification element, and generates the bias voltage based on an output signal of the filter circuit.

2. The power amplification circuit according to claim 1, wherein a size of the second amplification element is smaller than a size of the first amplification element.

3. The power amplification circuit according to claim 1, wherein a plurality of first amplification elements are provided, and
the variable bias voltage generation circuit generates the bias voltage for at least one of the plurality of first amplification elements.

4. The power amplification circuit according to claim 3, wherein the variable bias voltage generation circuit generates the bias voltage for a final-stage amplification element among the plurality of first amplification elements.

5. The power amplification circuit according to claim 3, wherein the variable bias voltage generation circuit includes a voltage adjustment circuit which generates the bias voltage at a first level for one amplification element among the plurality of first amplification elements and generates the bias voltage at a second level for another amplification element among the plurality of first amplification elements.

6. The power amplification circuit according to claim 1, wherein the variable bias voltage generation circuit includes a resistor which generates a voltage that decreases with an increase in level of the output signal of the second amplification element, and generates the bias voltage according to the voltage generated by the resistor.

7. The power amplification circuit according to claim 1, further comprising:
a first bias current generation circuit which generates a bias current of the first amplification element based on the bias voltage.

8. The power amplification circuit according to claim 7, further comprising:
a second bias current generation circuit which generates a bias current of the second amplification element based on a fixed bias voltage at a predetermined level.

9. The power amplification circuit according to claim 4,
wherein the variable bias voltage generation circuit includes a resistor which generates a voltage that decreases with an increase in level of the output signal of the second amplification element, and generates the bias voltage according to the voltage generated by the resistor.

10. The power amplification circuit according to claim 5,
wherein the variable bias voltage generation circuit includes a resistor which generates a voltage that decreases with an increase in level of the output signal of the second amplification element, and generates the bias voltage according to the voltage generated by the resistor.

11. The power amplification circuit according to claim 4, further comprising:
 a first bias current generation circuit which generates a bias current of the first amplification element based on the bias voltage.

12. The power amplification circuit according to claim 5, further comprising:
 a first bias current generation circuit which generates a bias current of the first amplification element based on the bias voltage.

13. The power amplification circuit according to claim 6, further comprising:
 a first bias current generation circuit which generates a bias current of the first amplification element based on the bias voltage.

14. The power amplification circuit according to claim 4,
wherein the variable bias voltage generation circuit includes a filter circuit which attenuates an AC component of an output signal of the second amplification element, and generates the bias voltage based on an output signal of the filter circuit.

15. The power amplification circuit according to claim 5,
wherein the variable bias voltage generation circuit includes a filter circuit which attenuates an AC component of an output signal of the second amplification element, and generates the bias voltage based on an output signal of the filter circuit.

16. The power amplification circuit according to claim 6,
wherein the variable bias voltage generation circuit includes a filter circuit which attenuates an AC component of an output signal of the second amplification element, and generates the bias voltage based on an output signal of the filter circuit.

17. The power amplification circuit according to claim 7,
wherein the variable bias voltage generation circuit includes a filter circuit which attenuates an AC component of an output signal of the second amplification element, and generates the bias voltage based on an output signal of the filter circuit.

18. The power amplification circuit according to claim 8,
wherein the variable bias voltage generation circuit includes a filter circuit which attenuates an AC component of an output signal of the second amplification element, and generates the bias voltage based on an output signal of the filter circuit.

19. A power amplification module comprising:
a power amplification circuit comprising:
 a first amplification element which amplifies and outputs an input signal with a gain according to a level of the input signal and a level of a bias voltage;
 a second amplification element which has the same gain characteristic as the first amplification element and amplifies and outputs the input signal; and
 a variable bias voltage generation circuit which generates the bias voltage, such that the bias voltage decreases with an increase in level of an output signal of the second amplification element,
wherein the variable bias voltage generation circuit includes a filter circuit which attenuates an AC component of an output signal of the second amplification element, and generates the bias voltage based on an output signal of the filter circuit.

\* \* \* \* \*